United States Patent
Izumi et al.

(10) Patent No.: US 11,327,118 B2
(45) Date of Patent: May 10, 2022

(54) BATTERY CAPACITY ESTIMATION METHOD AND BATTERY CAPACITY ESTIMATION DEVICE

(71) Applicant: TOYOTA JIDOSHA KABUSHIKI KAISHA, Toyota (JP)

(72) Inventors: Junta Izumi, Nagoya (JP); Masahiko Mitsui, Toyota (JP); Juni Yasoshima, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 318 days.

(21) Appl. No.: 16/718,596

(22) Filed: Dec. 18, 2019

(65) Prior Publication Data

US 2020/0200825 A1 Jun. 25, 2020

(30) Foreign Application Priority Data

Dec. 20, 2018 (JP) .............................. JP2018-238388

(51) Int. Cl.
*G01R 31/367* (2019.01)
*G01R 31/387* (2019.01)
(Continued)

(52) U.S. Cl.
CPC ......... *G01R 31/367* (2019.01); *G01R 31/387* (2019.01); *G06N 3/04* (2013.01); *G06N 3/08* (2013.01)

(58) Field of Classification Search
CPC .. G01R 31/367; G01R 31/387; G01R 31/389; G01R 31/3865; G01R 31/385;
(Continued)

(56) References Cited

U.S. PATENT DOCUMENTS 5,241,275 A 8/1993 Fang
2003/0184307 A1* 10/2003 Kozlowski .......... H01M 6/5044
324/427
(Continued)

FOREIGN PATENT DOCUMENTS

CN 105589040 A 5/2016
CN 106842066 A 6/2017
(Continued)

OTHER PUBLICATIONS

Hanif et al., Determining Battery SoC Using Electrochemical Impedance Spectroscopy and the Extreme Learning Machine, IEEE, (Year: 2015).*

(Continued)

*Primary Examiner* — Mohammad K Islam
(74) *Attorney, Agent, or Firm* — Sughrue Mion, PLLC

(57) ABSTRACT

A battery capacity estimation method includes first to third steps. The first step involves obtaining information about a Nyquist plot by a predetermined AC-IR measurement. The second step involves obtaining image data of a Nyquist diagram that is obtained when the AC-IR measurement is performed at a predetermined first temperature, based on the information about the Nyquist plot obtained in the first step and on an ambient temperature at which the AC-IR measurement is performed in the first step. The third step involves inputting the image data of the Nyquist diagram obtained in the second step to an input layer of a pre-trained neural network model, to obtain a battery capacity estimate value of a battery to be measured.

12 Claims, 8 Drawing Sheets

(51) Int. Cl.
*G06N 3/08* (2006.01)
*G06N 3/04* (2006.01)

(58) Field of Classification Search
CPC .......... G01R 31/396; G06N 3/04; G06N 3/08;
G06N 3/0454; Y02W 30/84; Y02E 60/10;
H01M 10/4285; H01M 10/54
See application file for complete search history.

(56) References Cited

U.S. PATENT DOCUMENTS

| | | |
|---|---|---|
| 2007/0090843 A1 | 4/2007 | De Doncker et al. |
| 2012/0316815 A1 | 12/2012 | Morigaki |
| 2015/0276889 A1 | 10/2015 | Osaka et al. |
| 2015/0303533 A1 | 10/2015 | Osaka et al. |
| 2016/0126590 A1 | 5/2016 | Roberts et al. |
| 2016/0134146 A1 | 5/2016 | Ling et al. |
| 2016/0195577 A1 | 7/2016 | Osaka et al. |
| 2019/0036373 A1 | 1/2019 | Shimura |
| 2019/0120910 A1* | 4/2019 | Ghantous .............. G01R 31/392 |
| 2019/0331738 A1 | 10/2019 | Kodama |
| 2020/0033414 A1 | 1/2020 | Izumi et al. |
| 2020/0041570 A1 | 2/2020 | Izumi et al. |
| 2020/0200826 A1 | 6/2020 | Izumi et al. |

FOREIGN PATENT DOCUMENTS

| | | |
|---|---|---|
| CN | 107290683 A | 10/2017 |
| JP | 2003-317810 A | 11/2003 |
| JP | 2016-90346 A | 5/2016 |
| JP | 2018-18354 A | 2/2018 |
| JP | 2018146441 A | 9/2018 |
| JP | 202020604 A | 2/2020 |
| JP | 202021592 A | 2/2020 |

OTHER PUBLICATIONS

Communication dated Jul. 6, 2021 from the U.S. Patent and Trademark Office in U.S. Appl. No. 16/718,829.
Communication dated Apr. 9, 2021, from the United States Patent and Trademark Office in U.S. Appl. No. 16/718,829.
Gao et al., "Electrochemical Impedance Spectroscopy Analysis Coating Deterioration Process with Kohonen Neural Networks", Journal of Chinese Society for Corrosion and Protection, 2005, vol. 25, No. 2, pp. 106-109 (5 pages total).

* cited by examiner

BATTERY CAPACITY ESTIMATION METHOD AND BATTERY CAPACITY ESTIMATION DEVICE

CROSS REFERENCE TO RELATED APPLICATIONS

The present application claims priority from Japanese Patent Application No. 2018-238388 filed on Dec. 20, 2018, which is incorporated by reference herein in its entirety.

BACKGROUND

The present disclosure relates to a battery capacity estimation method and a battery capacity estimation device.

JP 2003-317810 A discloses a method of estimating battery characteristics. The method of estimating battery characteristics disclosed in the publication involves determining the presence or absence of micro-short circuit in a secondary battery based on a reaction resistance value of the secondary battery that is acquired by an alternating current impedance measurement method.

SUMMARY

The present inventors have been investigating a method for accurately estimating a battery capacity of a secondary battery using an alternating current impedance measurement method.

In an embodiment of the present disclosure, a battery capacity estimation method includes a first step, a second step, and a third step. The first step is a step of obtaining, by a predetermined AC-IR measurement, information about a Nyquist plot of a battery to be measured. The second step is a step of obtaining image data of a Nyquist diagram that is obtained when the AC-IR measurement is performed at a predetermined first temperature, based on the information about the Nyquist plot obtained in the first step and on an ambient temperature at which the AC-IR measurement is performed in the first step. The third step is a step of inputting the image data of the Nyquist diagram obtained in the second step into a pre-trained neural network model, to obtain a battery capacity estimate value of a battery to be measured. The neural network model includes an input layer, an intermediate layer, and an output layer. The input layer is configured to receive the image data of the Nyquist diagram of the battery to be measured. The intermediate layer is configured to obtain a battery capacity estimate value based on the image data input to the input layer. The output layer is configured to output the battery capacity estimate value obtained by the intermediate layer.

With such a method, the temperature conditions of the AC-IR measurement become uniform for the image data of the Nyquist diagram that are input to the input layer of the neural network model, and therefore, it becomes possible to obtain the battery capacity estimate value accurately.

The pre-trained neural network model may be configured to learn, for the battery to be measured, training data including the image data of the Nyquist diagram that is obtained by the AC-IR measurement performed at the predetermined first temperature and an assessment value of battery capacity, the image data and the assessment value being associated with each other, to thereby obtain the battery capacity estimate value based on the image data input to the input layer.

The intermediate layer may include a plurality of artificial neurons, each of the artificial neurons including at least one weighting factor indicating a strength of a connection between artificial neurons, and the intermediate layer may be configured to perform a computation based on the weighting factor to obtain the battery capacity estimate value from the image data of the Nyquist diagram that are input to the input layer of the neural network model. In this case, the weighting factor may be determined by learning, for the battery to be measured, training data including the image data of the Nyquist diagram that is obtained by a predetermined method based on the Nyquist plot obtained by the AC-IR measurement at the predetermined first temperature, and an assessment value of battery capacity, the image data and the assessment value being associated with each other.

The information about the Nyquist plot obtained in the first step may include parameters of an equivalent circuit for obtaining a Nyquist diagram from the Nyquist plot.

The second step may further include correcting at least one of the parameter of the equivalent circuit for obtaining the Nyquist diagram from the Nyquist plot obtained in the first step based on the ambient temperature at which the AC-IR measurement is performed in the first step, to obtain the image data of the Nyquist diagram that is obtained when the AC-IR measurement is performed at the predetermined first temperature.

The second step may further include inputting an ambient temperature at which the AC-IR measurement is performed in the first step and image data of a Nyquist diagram obtained at the ambient temperature into a second pre-trained neural network model, to obtain the image data of the Nyquist diagram that is obtained when the AC-IR measurement is performed at the predetermined first temperature.

The second pre-trained neural network model may be configured to learn, for the battery to be measured, second training data including an ambient temperature at which the AC-IR measurement is performed, image data of a Nyquist diagram that is obtained at the ambient temperature, and the image data of the Nyquist diagram that is obtained by the AC-IR measurement at the predetermined first temperature, which are associated with each other, to thereby obtain the image data of the Nyquist diagram that is obtained when the AC-IR measurement is performed at the predetermined first temperature, based on the ambient temperature and the image data of the Nyquist diagram that are input to the input layer of the second pre-trained neural network model.

Embodiments of a battery capacity estimation device disclosed herein includes a first recording unit, a pre-processing unit, and a capacity estimation unit. The first recording unit records information about a Nyquist plot and an ambient temperature at which the AC-IR measurement is performed to obtain the Nyquist plot, the information and the ambient temperature being associated with each other. The pre-processing unit is configured to obtain image data of a Nyquist diagram that is obtained when the AC-IR measurement is performed at a predetermined first temperature, based on the ambient temperature and the information about the Nyquist plot that are recorded in the first recording unit. The capacity estimation unit is configured to obtain a battery capacity estimate value using a pre-trained neural network model. Here, the pre-trained neural network model includes an input layer and an intermediate layer. The input layer is configured to receive the image data of the Nyquist diagram that are obtained by the pre-processing unit, and the intermediate layer is configured to obtain a battery capacity estimate value based on the image data input to the input layer.

The embodiments of the battery capacity estimation device enables the pre-processing unit to obtain image data of the Nyquist diagram that is obtained by the AC-IR measurement performed at a predetermined first temperature. Then, the image data of the Nyquist diagram obtained by the pre-processing unit are input into the input layer of the neural network model, and a battery capacity estimate value is obtained based on the image data input to the input layer. The temperature conditions of the AC-IR measurement become uniform for the image data of the Nyquist diagram that are input to the input layer of the neural network model, and therefore, it becomes possible to obtain the battery capacity estimate value accurately.

DETAILED DESCRIPTION

Hereinbelow, embodiments of a battery capacity estimation method and a battery capacity estimation device according to the present disclosure will be described in detail. It should be noted, however, that the embodiments described herein are, of course, not intended to limit the present invention. The present invention is not limited to the embodiments described herein unless specifically stated otherwise.

The embodiments of the battery capacity estimation method and the battery capacity estimation device use a Nyquist plot and a Nyquist diagram as the measurement results obtained by an AC-IR measurement, in order to estimate a battery capacity.

Herein, the AC-IR measurement, the Nyquist plot, and the Nyquist diagram will be described first.

AC-IR Measurement

In the AC-IR measurement, an alternating current impedance in the battery is measured while varying the frequency within a predetermined frequency range. For example, alternating current signals at a plurality of frequencies within a range of 1 MHz to 100 mHz are successively applied across the electrodes of a secondary battery. Each time an alternating current signal of a corresponding frequency is applied, a response signal is measured. A real component and an imaginary component of impedance are calculated for each combination of the applied alternating current signal and the response signal, and they are plotted respectively on the horizontal axis and the vertical axis of a two-dimensional coordinate. Accordingly, the measurement values of the AC-IR measurement are obtained as a Nyquist plot. The AC-IR measurement is also referred to as an alternating current impedance measurement.

Measurement Device 60

Figure 1:
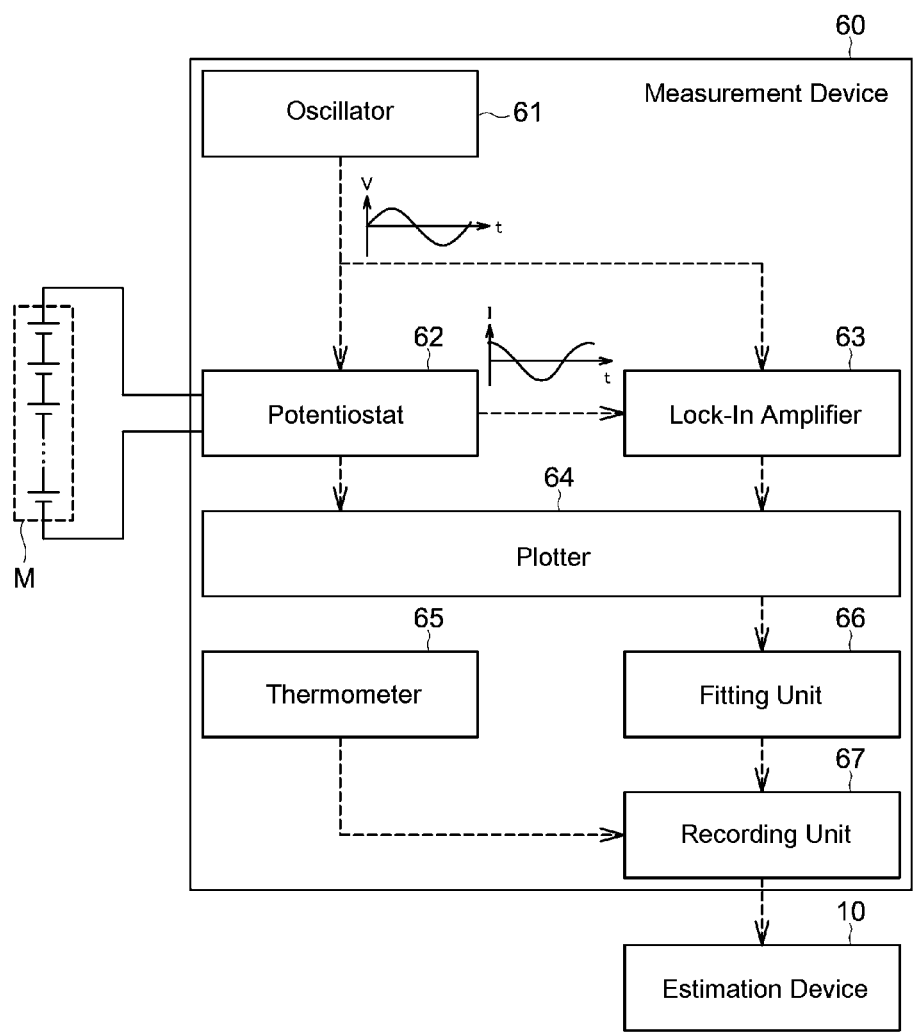
FIG. 1 is a schematic view illustrating an example of a measurement device 60 that performs an AC-IR measurement.

FIG. 1 is a schematic view illustrating an example of a measurement device 60 that performs an AC-IR measurement.

The measurement device 60 includes an oscillator 61, a potentiostat 62, a lock-in amplifier 63, a plotter 64, a thermometer 65, a fitting unit 66, and a recording unit 67. Although not shown in the drawings, the measurement device 60 may include, for example, a controller (for example, a processor such as a CPU), a memory, and input/output ports.

Various components of the measurement device 60, such as the fitting unit 66 and the recording unit 67, may be embodied by cooperative combinations of hardware configurations of the measurement device 60 with software that are programmed to achieve predetermined functions. The measurement device 60 may be configured as a single device, as illustrated in FIG. 1. Alternatively, the measurement device 60 may be configured as an apparatus including a plurality of devices that function cooperatively.

Referring to FIG. 1, the module M is a secondary battery module that is to be measured. Although the secondary battery module is illustrated herein as a battery pack, the secondary battery that is to be measured may also be a single battery cell.

The oscillator 61 is a device that outputs sine waves of the same phase to the potentiostat 62 and the lock-in amplifier 63.

The potentiostat 62 generates alternating current application signals, and applies the generated application signals to the module M. In the present embodiment, the potentiostat 62 generates an alternating current application signal by superposing a predetermined direct current voltage on an alternating current voltage (for example, a voltage with an amplitude of about 10 mV) that is in the same phase as that of the sine wave output from the oscillator 61. Another feature of the potentiostat 62 is to detect electric current passing through the module M. The potentiostat 62 outputs, as a response signal, the detection result of the current to the lock-in amplifier 63. Still another feature of the potentiostat 62 is to output the application signal and the response signal to the plotter 64.

The lock-in amplifier 63 is a device that compares the phase of the sine wave that is output from the oscillator 61 and the phase of the response signal that is output from the potentiostat 62. In the present embodiment, the lock-in amplifier 63 outputs the result of the comparison (i.e., the phase difference between the sine wave and the response signal) to the plotter 64.

The plotter 64 is a device that plots the measurement results of the alternating current impedance of the module M onto a complex plane. In the present embodiment, the plotter 64 plots the measurement results of the alternating current impedance of the module M onto a complex plane based on the signals from the potentiostat 62 and the signals from the lock-in amplifier 63. Here, the signal from the potentiostat 62 indicates the amplitude ratio between the application signal and the response signal. The signal from the lock-in amplifier 63 indicates the phase difference between the application signal and the response signal.

The thermometer 65 is installed in the measurement device 60. The thermometer 65 is a device that measures the ambient temperature at which the AC-IR measurement is performed. For example, the thermometer 65 may be configured to detect the ambient temperature of the environment in which the measurement device 60 is placed, with a temperature sensor attached to a predetermined portion of the measurement device 60.

In the measurement device 60 of the present embodiment, the frequency of the sine wave that is output from the oscillator 61 is swept over a predetermined frequency range. In response to this, the above-described processes by the potentiostat 62 and the lock-in amplifier 63 are executed repeatedly. Thereby, the measurement results of alternating current impedance of the module M that are acquired for various frequencies of the sine wave output from the oscillator 61 are plotted on a complex plane by the plotter 64. The resulting plot is referred to as a Nyquist plot. The Nyquist plot is also referred to as a Cole-Cole plot.

It should be noted that the configuration of the measurement device 60 is not limited to that illustrated in FIG. 1. For example, it is described that the potentiostat 62 of the present embodiment applies an alternating current voltage to the module M and detects the electric current passing through the module M while applying the voltage. However, it is also possible that the potentiostat 62 may detect a voltage response while applying an alternating current to the module M. It is also possible that the measurement device 60 may include a frequency response analyzer in place of the lock-in amplifier 63.

Furthermore, it is also possible to modify the technique of the alternating current impedance measurement. For example, it is also possible that the measurement device 60 may generate an application signal containing various frequency components within a predetermined frequency range (either one of voltage signal or current signal) and it may detect the response signal (the other one of voltage signal or current signal) while applying the application signal. It is also possible that the measurement device 60 may calculate an alternating current impedance for each of the frequencies by performing a fast Fourier transform on each of the application signal and the response signal.

Nyquist Plot Np

Figure 2:
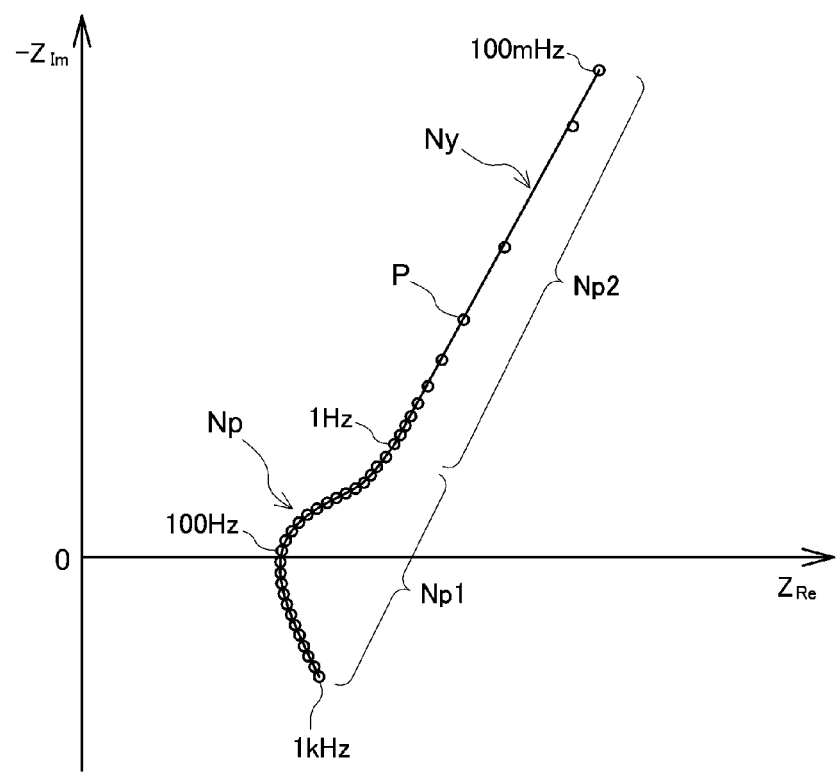
FIG. 2 is a graph illustrating an example of Nyquist plot for a plurality of modules M.

FIG. 2 is a graph illustrating an example of Nyquist plot for a plurality of modules M.

The horizontal axis in FIG. 2 represents the real component ($Z_{Re}$) of alternating current impedance (complex impedance) of module M. The vertical axis in FIG. 2 represents the imaginary component ($-Z_{Im}$) of alternating current impedance (complex impedance) of module M.

In the present embodiment, the measurement device 60 applies, for example, application signals having various frequencies in the range of 100 mHz to 1 kHz to the module M. Since the signals with various frequencies are applied to the module M, the measurement results of alternating current impedance of the module M corresponding to the frequencies are plotted on a complex plane as discrete values, as shown in FIG. 2. A set of plot points p that are obtained by the measurement as described above is referred to as a "Nyquist plot Np".

As illustrated in FIG. 2, application signals with 52 different frequencies in the frequency range of 100 mHz to 1 kHz are used for the Nyquist plot Np. The acquired Nyquist plot Np includes a semi-circular portion Np1 in a substantially arc shape, which is obtained from application signals at high frequencies, and a linear portion Np2 in a substantially linear shape, which is obtained from application signals at low frequencies. Herein, in the example shown in FIG. 2, the boundary is approximately at 1 Hz, and the application signals having a frequency of 1 Hz to 1 kHz are classified as high frequency, which may form the semi-circular portion Np1. On the other hand, the application signals having a frequency of 100 mHz to 1 Hz are classified as low frequency, which may form the linear portion Np2. The application signal having a frequency of 1 Hz may be either high frequency or low frequency.

Nyquist Diagram Ny

The measurement device 60 is configured to obtain a Nyquist diagram Ny that follows the Nyquist plot Np by a predetermined method. In the present embodiment, the Nyquist diagram Ny is obtained by the fitting unit 66.

Equivalent Circuit

The fitting unit 66 is configured to obtain an equivalent circuit by analyzing the Nyquist plot Np obtained as the results of measurement. The measurement results are fitted to an equivalent circuit, whereby a Nyquist diagram Ny according to the Nyquist plot Np obtained as the results of measurement is obtained. Herein, reference is made to FIG. 2 as appropriate in describing the Nyquist plot Np and the Nyquist Diagram Ny.

For the fitting unit 66, an equivalent circuit may be determined in advance according to a secondary battery that is to be measured (the module M in the present embodiment), for example. In the fitting unit 66, an equivalent circuit that shows a frequency characteristic of the alternating current impedance of the module M may be constructed in advance, for example, based on the evaluation results or the simulation results for a large number of modules. In this case, the fitting unit 66 may be configured to vary the parameters of the elements in the equivalent circuit and fit the parameters to the Nyquist plot Np, so that a Nyquist diagram Ny can be obtained according to the Nyquist plot Np obtained as the results of the measurement.

An Example of Equivalent Circuit Model 80

Figure 3:
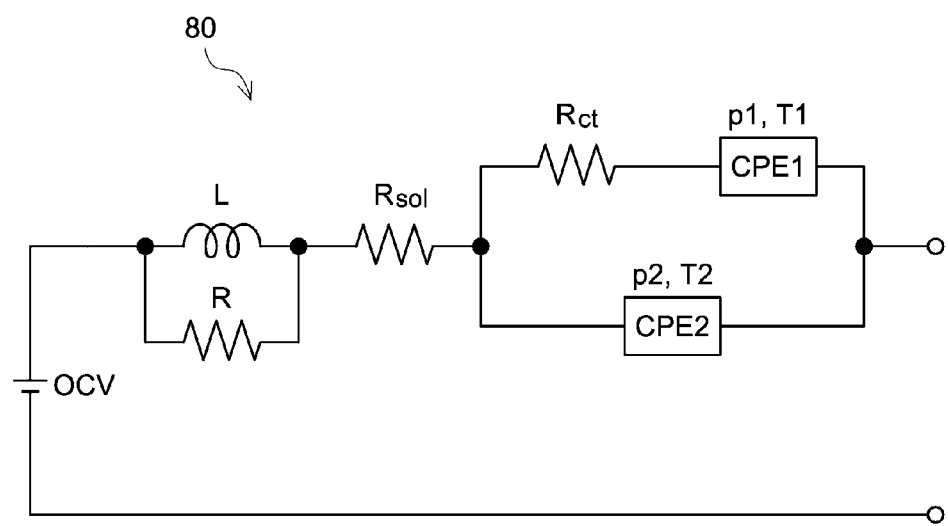
FIG. 3 is a circuit diagram illustrating an example of an equivalent circuit model 80.

FIG. 3 is a circuit diagram illustrating an example of an equivalent circuit model 80. As illustrated in FIG. 3, the equivalent circuit model 80 includes, as circuit parameters (model parameters), junction inductance L, junction resistance R, solution resistance Rsol, charge transfer resistance Rct, diffusion resistance (represented as CPE1), and electric double layer capacitance (represented as CPE2).

In the equivalent circuit model 80 shown here, the junction inductance L is an inductance component at a junction between cells (i.e., the junction between the positive electrode and the negative electrode) contained in the module M (see FIG. 1). The junction resistance R is a resistance component at the just-mentioned junction. The solution resistance Rsol is a resistance component of the electrolyte solution that exists between the positive electrode and the negative electrode. The charge transfer resistance Rct is a resistance component that relates to charge transfer (transmission and reception of charge) at the electrode/electrolyte interface (i.e., the surfaces of the positive electrode active material and the negative electrode active material). The diffusion resistance CPE1 is a resistance component that relates to diffusion of salt in the electrolyte solution or diffusion of charge transfer substance in the active material. The electric double layer capacitance CPE2 is a capacitance component of an electric double layer capacitance CPE2 that is formed at the electrode/electrolyte interface. It should be noted that each of the circuit parameters is one obtained by combining the corresponding components of all the cells in the module M.

The junction inductance L and the junction resistance R are connected in parallel with each other. The solution resistance Rsol is connected in series with the parallel circuit of the junction inductance L and the junction resistance R. The charge transfer resistance Rct and the diffusion resistance CPE1 are connected in series with each other. This series circuit of the charge transfer resistance Rct and the diffusion resistance CPE1 is connected in parallel with the electric double layer capacitance CPE2. The circuit including the junction inductance L, the junction resistance R, and the solution resistance Rsol is connected in series with the circuit including the charge transfer resistance Rct, the diffusion resistance CPE1, and the electric double layer capacitance CPE2.

Each of the diffusion resistance and the electric double layer capacitance in the module M is expressed by a nonlinear element called a constant phase element (CPE). Specifically, an impedance ZCPE1 corresponding to the diffusion resistance CPE1 can be expressed by the following Equation (1) using a CPE index p1 and a CPE constant T1. Note that in Equation (1), the angular frequency of the alternating current signal applied to the module (i.e., application signal) is represented by $\omega$ ($\omega=2\pi f$).

$$ZCPE1=1/\{(j\omega)p1 \times T1\} \quad (1)$$

Likewise, an impedance ZCPE2 corresponding to the electric double layer capacitance CPE2 can be expressed by the following equation (2) using a CPE index p2 and a CPE constant T2.

$$ZCPE2=1/\{(j\omega)p2 \times T2\} \quad (2)$$

Thus, the equivalent circuit model 80 shown in FIG. 3 includes the following eight circuit parameters: the junction inductance L, the junction resistance R, the solution resistance Rsol, the charge transfer resistance Rct, the CPE index p1, the CPE constant T1, the CPE index p2, and the CPE constant T2. The combined impedance of the module M is expressed by a predetermined expression that uses these eight circuit parameters (L, R, Rsol, Rct, p1, T1, p2, and T2) contained in the equivalent circuit model.

The fitting unit 66 performs a fitting process (curvilinear regression) of an impedance curve so that the impedance curve best fits the Nyquist plot Np obtained by the plotter 64. As the technique of the curvilinear regression, it is possible to use the nonlinear least squares method (LSQ), for example. Specifically, at each of the frequencies of the application signals, the fitting unit 66 calculates a coordinate that is plotted (measured) at the frequency and a coordinate on the impedance curve that corresponds to the frequency. Then, the square of the distance (i.e., error) between the coordinates is calculated for every frequency of the application signals. The calculated values are totaled. In other words, the sum of squared errors is calculated. Then, the eight circuit parameters (L, R, Rsol, Rct, p1, T1, p2, and T2) contained in the equivalent circuit model 80 are adjusted so that the sum of squares of the errors can be minimized. The fitting process using the nonlinear least squares method is repeated until a predetermined convergence condition is satisfied. The convergence condition herein may be specified as, for example, the time until a value indicating goodness of fit, such as a chi-square value, falls below a determination value. As a result, when the convergence condition is satisfied, a Nyquist diagram Ny as an impedance curve is determined.

FIG. 2 shows a Nyquist diagram Ny obtained by a fitting process for the results of the alternating current impedance measurement for the module M. The Nyquist diagram Ny is obtained as a line that approximately fits the Nyquist plot Np.

Although the present embodiment describes an example of the technique for obtaining an equivalent circuit and a Nyquist diagram Ny for the measurement device 60, the Nyquist diagram Ny may be obtained by a predetermined method based on a Nyquist plot obtained through an AC-IR measurement. For example, the above-described example illustrates the least squares method as a fitting algorithm for a predetermined equivalent circuit model 80. However, the fitting algorithm is not limited to the least squares method. For example, it is also possible that adjacent plot points in the Nyquist plot Np may be connected by a straight line. It is also possible to employ other algorithms, such as polynomials including quadratic polynomials and cubic polynomials, power approximation, and genetic algorithm (GA). In addition, the fitting unit 66 is not limited to the technique that utilizes the equivalent circuit model 80, and the fitting unit 66 may be configured to recognize the Nyquist plot Np obtained by an AC-IR measurement method using an image processing technology and to obtain a line that fits the Nyquist plot Np as a Nyquist diagram Ny by a predetermined method.

As illustrated in FIG. 1, the recording unit 67 is configured to record the ambient temperature acquired by the thermometer 65 and the information about the Nyquist plot Np (see FIG. 2) obtained by the measurement device 60 so as to be associated with each other. The recording unit 67 may record the data in a predetermined format.

Herein, the information about the Nyquist plot Np may be required information selected from at least one of the following: the Nyquist plot Np obtained as the results of alternating current impedance measurement, the equivalent circuit model 80 obtained as the results of fitting the parameters to the Nyquist plot Np by the fitting unit 66, the parameters of the equivalent circuit model 80, and the image data of the Nyquist diagram Ny. The parameters of the equivalent circuit model 80 may be the eight circuit parameters (L, R, Rsol, Rct, p1, T1, p2, and T2) contained in the equivalent circuit model 80.

The present inventors intend to estimate battery capacity accurately and efficiently. In investigating techniques to accomplish the purpose, the present inventors have conceived an idea of obtaining a battery capacity by building a pre-trained neural network model, while paying special attention to the fact that there is a correlation between Nyquist plot Np and battery capacity. Furthermore, in order to improve the accuracy of the battery capacity, the present inventors have conceived of an idea of obtaining a battery capacity estimate value by building a pre-trained neural network model using the image data of a Nyquist diagram Ny as the input data so as to obtain the battery capacity estimate value from the image data of the Nyquist diagram Ny.

Image Data of Nyquist Diagram Ny

The image data of the Nyquist diagram Ny may be image data in which the Nyquist diagram Ny is extracted from the image data of FIG. 2. For example, the image data of the Nyquist diagram Ny may be such image data of the Nyquist diagram Ny of FIG. 2 from which unnecessary information such as the plot points p of the Nyquist plot Np are eliminated and in which only the vertical axis, the horizontal axis, and the Nyquist diagram Ny are left. It should be noted that the image data of the Nyquist diagram Ny may include information other than the Nyquist diagram Ny. For example, the image data of the Nyquist diagram Ny may also contain plot points p of the Nyquist plot Np. The image data of the Nyquist diagram Ny may be image data that contain the Nyquist diagram Ny as illustrated in FIG. 2, and may be image data from which the Nyquist diagram Ny can be extracted by predetermined image processing performed by a computer. It is also possible that coordinate data of the Nyquist diagram Ny may be added to the image data of the Nyquist diagram Ny.

The image data of the Nyquist diagram Ny can be created by image processing according to a prestored predetermined program executed by a computer. The image processing by a computer can be implemented using image processing software. The image processing may be programmed to create the image data of the Nyquist diagram Ny from an AC-IR measurement and the data produced by processing the measurement values of the AC-IR measurement, such as a Nyquist plot Np, an equivalent circuit model 80 (see FIG. 3), or a Nyquist diagram Ny. The image data of the Nyquist diagram Ny may be processed so that the width, color, or the like of the line of the Nyquist diagram Ny is modified. The width of the line of the Nyquist diagram Ny may be set to an appropriate width so that, for example, measurement errors of the Nyquist plot Np can be included in the line of the Nyquist diagram Ny. When the color of the Nyquist diagram Ny is set to be a predetermined specific color, the line of the Nyquist diagram Ny is recognized more easily in the image processing by a computer. This can improve the accuracy of the image processing that uses the image data of the Nyquist diagram Ny.

A pre-trained neural network model is built so that a battery capacity estimate value can be obtained by inputting such image data of the Nyquist diagram Ny, so that the battery capacity estimate value is obtained from the image data of the Nyquist diagram Ny. The image data of the Nyquist diagram Ny contains a greater amount of information than the Nyquist plot Np. This means that, with such a method, the further the learning of the neural network model proceeds, the higher the accuracy of the battery capacity estimate value that is obtained. In addition, by utilizing a pre-trained neural network model, the computation for obtaining a battery capacity estimate value can be made easily, so that the battery capacity estimate value can be obtained accurately and efficiently.

However, in the Nyquist plot Np obtained by an AC-IR measurement, the positions of the obtained plot points p can vary depending of the ambient temperature of the measurement device 60 when performing the AC-IR measurement. When the positions of the plot points p vary, the image data of the Nyquist diagram Ny changes accordingly. This means that, when the ambient temperature of the measurement device 60 fluctuates, the measurement results of the AC-IR measurement fluctuate accordingly even though the pre-trained neural network model is used as the data for inputting the image data of the Nyquist diagram Ny into the input layer. Therefore, it may not be possible to obtain the battery capacity estimate value accurately.

In view of this, it is possible to manage the ambient temperature of the measurement device 60 when performing the AC-IR measurement to reduce the fluctuation of the ambient temperature so that the battery capacity estimate value can be obtained accurately. However, it is expected that the cost will increase in order to stabilize the ambient temperature of the measurement device 60. Moreover, in order to stabilize the ambient temperature of the measurement device 60 in the AC-IR measurement, it is necessary that the measurement device 60 be placed in a thermostatic chamber for a predetermined time (for example, for 2 hours) to adjust the temperature before the AC-IR measurement is performed. This results in poor efficiency.

Battery Capacity Estimation Method

Figure 4:
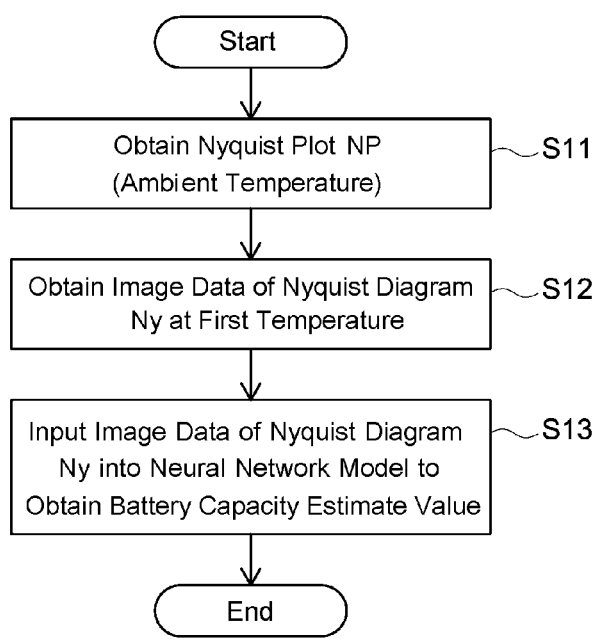
FIG. 4 is a flow-chart illustrating a battery capacity estimation method according to the present disclosure.

FIG. 4 is a flow-chart illustrating a battery capacity estimation method according to the present disclosure. As illustrated in FIG. 4, an embodiment of the battery capacity estimation method disclosed herein includes a first step (S11), a second step (S12), and a third step (S13).

The first step (S11) involves obtaining information about a Nyquist plot Np by a predetermined AC-IR measurement (see FIG. 2).

The second step (S12) involves obtaining image data of a Nyquist diagram Ny2 (see FIG. 6) that is to be obtained when the AC-IR measurement is performed at a predetermined first temperature, based on the information about the Nyquist plot obtained in the first step (S11) and on an ambient temperature Tk at which the AC-IR measurement is performed in the first step (S11).

The third step (S13) involves inputting the image data of the Nyquist diagram Ny2 obtained in the second step (S12) into a pre-trained neural network model 20 (see FIG. 5), to obtain a battery capacity estimate value of a battery to be measured.

With such a battery capacity estimation method, the temperature conditions of the AC-IR measurement become uniform for the image data of the Nyquist diagram that is input to the input layer 21 of the neural network model 20, and therefore, it becomes possible to obtain the battery capacity estimate value accurately.

Battery Capacity Estimation Device 10

Figure 5:
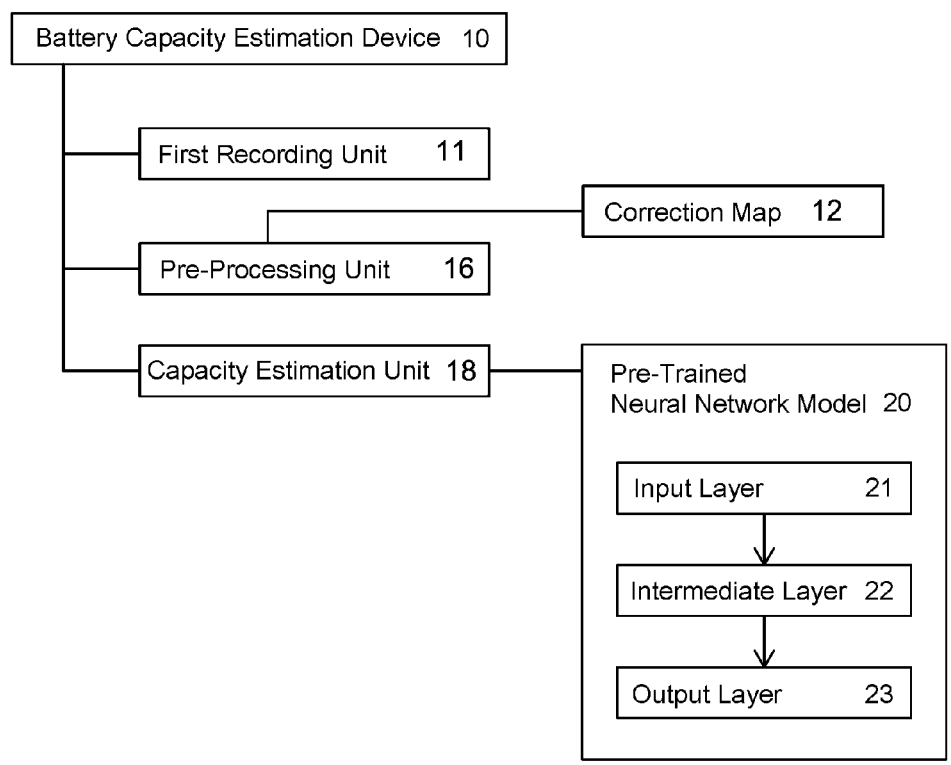
FIG. 5 is a configuration diagram illustrating a battery capacity estimation device 10.

FIG. 5 is a configuration diagram illustrating a battery capacity estimation device 10. The battery capacity estimation device 10 is an example of the device that embodies a battery capacity estimation method. As illustrated in FIG. 5, the battery capacity estimation device 10 includes a first recording unit 11, a pre-processing unit 16, and a capacity estimation unit 18. The capacity estimation unit 18 includes a pre-trained neural network model 20.

The first recording unit 11 records information about a Nyquist plot Np and an ambient temperature when the AC-IR measurement was performed to obtain the Nyquist plot Np, in association with each other. Herein, reference is made to FIG. 2 as appropriate in describing the Nyquist plot Np and the Nyquist Diagram Ny. The information about the Nyquist plot Np herein may be measurement values obtained by the AC-IR measurement, analysis results of an equivalent circuit analysis, and the like, which may include a Nyquist plot Np, an equivalent circuit model 80, parameters of an equivalent circuit, a Nyquist diagram Ny, and image data of the Nyquist diagram Ny.

The pre-processing unit 16 is configured to obtain image data of a Nyquist diagram Ny that is obtained when the AC-IR measurement is performed at a predetermined first temperature, based on the ambient temperature and the information about the Nyquist plot Np, which are recorded in the first recording unit 11.

Pre-Trained Neural Network Model 20

The capacity estimation unit 18 is configured to execute a battery capacity estimation process using the pre-trained neural network model 20. The pre-trained neural network model 20 includes an input layer 21, an intermediate layer 22, and an output layer 23.

The input layer 21 is configured to receive the image data of the Nyquist diagram obtained by the pre-processing unit 16.

The intermediate layer 22 is configured to output a battery capacity estimate value based on the image data input to the input layer 21.

The output layer 23 is configured to output the battery capacity estimate value corresponding to the image data input to the input layer 21, based on the intermediate layer 22.

Figure 6:
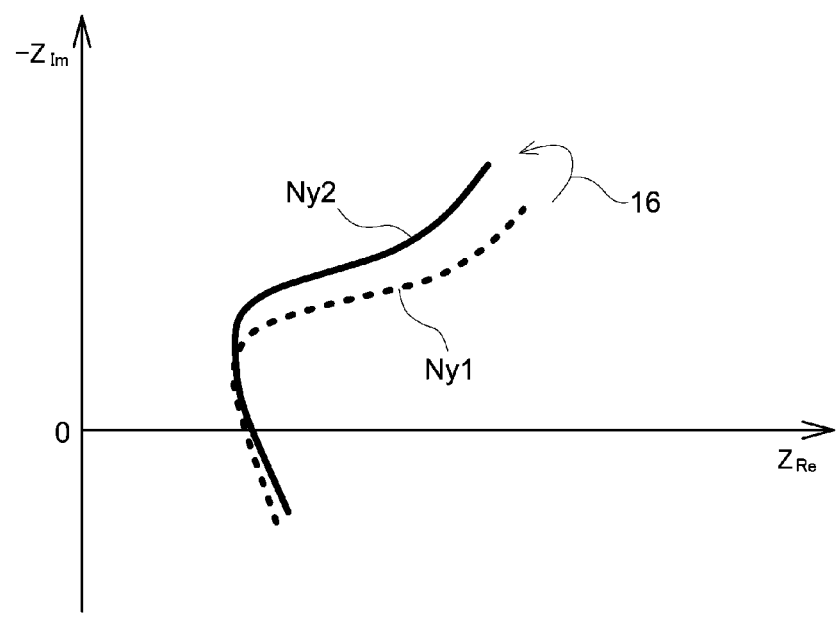
FIG. 6 is a schematic view illustrating a process performed by a pre-processing unit 16.

FIG. 6 is a schematic view illustrating a process performed by the pre-processing unit 16. As illustrated in FIG. 6, the pre-processing unit 16 can obtain image data of the Nyquist diagram Ny2 that is obtained by a predetermined method based on the Nyquist plot Np obtained when the AC-IR measurement is performed at a predetermined first temperature, in contrast to the Nyquist diagram Ny1 that is obtained depending on the ambient temperature at which the AC-IR measurement is performed.

With this battery capacity estimation device 10, the pre-processing unit 16 obtains the image data of the Nyquist diagram Ny2 (see FIG. 6) that is obtained by the AC-IR measurement performed at a predetermined first temperature. Then, the image data of the Nyquist diagram obtained by the pre-processing unit 16 are input into the input layer 21 of the neural network model 20, and a battery capacity estimate value is obtained based on the image data input to the input layer 21. The temperature conditions of the AC-IR measurement become uniform for the image data of the Nyquist diagram that are input to the input layer 21 of the neural network model 20, and therefore, it becomes possible to obtain the battery capacity estimate value accurately.

The pre-trained neural network model 20 may be constructed to learn, for a battery that is to be measured, training data including image data of the Nyquist diagram Ny and an assessment value of battery capacity that are associated with each other, to thereby obtain a battery capacity estimate value based on the image data input to the input layer 21. Herein, the image data of the Nyquist diagram Ny that are contained in the training data may be the image data of the Nyquist diagram Ny that is obtained by the AC-IR measurement performed at a predetermined first temperature. In other words, the image data of the Nyquist diagram Ny that are contained in the training data may be the image data of the Nyquist diagram Ny that is obtained by performing the AC-IR measurement after the ambient temperature of the measurement device 60 has been stabilized at a predetermined first temperature. The assessment values of battery capacity are assessment values of battery capacity of the battery that is The assessment values of battery capacity may be determined to be values that correlate with the image data of the Nyquist diagram Ny. The assessment values of battery capacity may be, for example, actually measured values of battery capacity of the battery to be measured, when the image data of the Nyquist diagram Ny have been obtained.

In the present embodiment, the image data of the Nyquist diagram Ny that are contained in the training data for the pre-trained neural network model 20 are the image data of the Nyquist diagram Ny that has been obtained by the AC-IR measurement performed at a predetermined first temperature. The image data of the Nyquist diagram Ny2 (see FIG. 6) that has been obtained by the AC-IR measurement performed at a predetermined first temperature, which have been obtained by the pre-processing unit 16 of the battery capacity estimation device 10, are input into the input layer 21. As a result, the battery capacity estimate value can be obtained more accurately.

Here, the assessment value of the battery capacity may be defined as, for example, a battery capacity of the battery to be measured that is at a predetermined state of charge. For example, the assessment value of the battery capacity may be defined as a battery capacity of the battery to be measured that is in a fully charged state (100% SOC). The assessment value of the battery capacity may be the battery capacity of the battery to be measured that is at a state of charge of 80% (80% SOC). That is, it is possible that the target variable may be set to 80% of the capacity, as compared to the battery capacity at a fully charged state. Thus, the state of charge that defines the assessment value of battery capacity is not limited to the fully charged state, but may be any level of state of charge for a battery to be measured. Also, when there are various states of charge that specify the assessment value of battery capacity in the training data, it is possible that the states of charge that specify the assessment value of battery capacity may be made uniform by converting them into a battery capacity at a specified state of charge, such as 100% SOC and 80% SOC.

Similarly, regarding the battery capacity estimate value, it is also possible to construct the pre-trained neural network model 20 so as to output a battery capacity of the battery to be measured that is in a predetermined state of charge. Additionally, regarding the battery capacity estimate value, it is also possible to construct the pre-trained neural network model 20 so as to obtain a plurality of battery capacities of the battery to be measured that is in a plurality of predetermined states of charge. In this case, the battery capacity estimate values obtained by the pre-trained neural network model 20 as the results of processing by the capacity estimation unit 18 may be a plurality of battery capacities of the battery to be measured that is at a plurality of states of charge, such as a battery capacity at a fully charged state (100% SOC), a battery capacity at 80% SOC, and a battery capacity at 60% SOC.

Herein, although not shown in the drawings, the intermediate layer 22 of the neural network model 20 may include, for example, a plurality of artificial neurons. Each of the artificial neurons includes at least one weighting factor indicating the strength of a connection between artificial neurons. The intermediate layer 22 is configured to perform a computation based on the weighting factor to obtain a battery capacity estimate value from the image data of the Nyquist diagram Ny that are input to the input layer 21 of the neural network model 20. The weighting factor may be determined by, for the battery to be measured (i.e., module M: see FIG. 1), learning the training data including image data of the Nyquist diagram Ny obtained by an AC-IR measurement performed at a predetermined first temperature and an assessment value of battery capacity, the image data and the assessment value being associated with each other. Furthermore, the intermediate layer 22 may include a plurality of so-called hidden layers each including a plurality of artificial neurons.

Herein, the learning method for the neural network model 20 is not limited to any particular learning method. For example, it is possible to employ various types of learning methods for the neural network model 20, as appropriate, such as deep learning and various types of machine learning based on supervised training data. Likewise, the learning method for a later-described second pre-trained neural network model 30 is not limited to any particular learning method.

Here, an embodiment of the pre-processing unit 16 will be described.

In the present embodiment, the battery capacity estimation device 10 further includes a correction map 12, as illustrated in FIG. 5. The correction map 12 may record ambient temperatures at which the AC-IR measurement is performed, and correction values that correct the parameters of the equivalent circuit for obtaining the Nyquist diagram Ny from the Nyquist plot Np, in such a manner that they are associated with each other.

The information about the Nyquist plot Np that is recorded in the first recording unit 11 may include parameters of an equivalent circuit. The equivalent circuit herein may be, for example, an equivalent circuit model 80 shown in FIG. 3. In this case, the parameters of the equivalent circuit include, as the circuit parameters (model parameters), junction inductance L, junction resistance R, solution resistance Rsol, charge transfer resistance Rct, diffusion resistance (represented as CPE1), and electric double layer capacitance (represented as CPE2).

The pre-processing unit 16 may be configured to correct the parameters of the equivalent circuit (L, R, Rsol, Rct, p1, T1, p2, and T2: see FIG. 3) that are obtained as the information about the Nyquist plot Np (see FIG. 2) based on the ambient temperature recorded in the first recording unit 11. The pre-processing unit 16 may be configured to obtain image data of the Nyquist diagram Ny (see FIG. 2) that is obtained when the AC-IR measurement is performed at a predetermined first temperature, using the equivalent circuit obtained from the corrected parameters.

In this case, the battery capacity estimation device 10 may further include a correction map 12. The correction map 12 records ambient temperatures at which the AC-IR measurement is performed, and correction values that correct the parameters of the equivalent circuit for obtaining the Nyquist diagram Ny from the Nyquist plot Np, in such a manner that they are associated with each other. It should be noted that although the correction map 12 is used herein, it is also possible to prepare a correction formula in place of the correction map 12, or as one embodiment of the correction map 12, when the correlation of the parameters of the equivalent circuit with temperatures has been obtained as the correction formula.

When this is the case, the pre-processing unit 16 may correct the parameters of the equivalent circuit, based on the parameters of the equivalent circuit that are obtained based on the information about the Nyquist plot recorded in the first recording unit 11, the ambient temperature Tk recorded in the first recording unit 11, and the correction map 12. Thus, based on the corrected parameters of the equivalent circuit, the pre-processing unit 16 may obtain image data of the Nyquist diagram Ny that is obtained when the AC-IR measurement is performed at a predetermined first temperature.

For example, to the knowledge of the present inventors, the equivalent circuit model 80 shown in FIG. 3 includes the eight circuit parameters (L, R, Rsol, Rct, p1, T1, p1, and T2) as the parameters of the equivalent circuit. The relationship between the parameters of the equivalent circuit and the ambient temperature Tk of the measurement device 60 should be found in advance. Then, based on the relationship between the parameters of the equivalent circuit 80 and the ambient temperature Tk of the measurement device 60, the correction map 12 may be prepared that records the relationship between the ambient temperature and the correction value for the parameters of the equivalent circuit model 80.

When the parameters of the equivalent circuit model 80 have a difference in how they are affected by the ambient temperature of the measurement device 60, one(s) of the parameters that is/are more likely to be affected by the ambient temperature of the measurement device 60 may be corrected according to the ambient temperature of the measurement device 60. For example, it is assumed that the junction inductance L, the junction resistance R, the solution resistance Rsol, and the CPE index p1 are more susceptible to the ambient temperature of the measurement device 60 than the other parameters. When this is the case, the correction map 12 may be configured so that the parameters L, R, Rsol, and p1 are corrected according to the ambient temperature of the measurement device 60. Thus, the correction map 12 may be prepared so that the correction is made to those of the parameters that are particularly likely to be affected by the ambient temperature of the measurement device 60. The correction map 12 may be prepared as appropriate, depending on the battery to be measured.

Thus, the correction map 12 may set a correction value for one(s) of the parameters of the equivalent circuit that is particularly likely to be affected by the ambient temperature of the measurement device 60. To the knowledge of the present inventors, among the parameters of the equivalent circuit, the shape of the Nyquist diagram Ny in a low frequency range is more likely to affect the battery capacity estimate value. In that case, the correction map 12 may be configured to correct the parameters that affect the shape of the Nyquist diagram Ny in a low frequency range.

On the other hand, if the shape of the Nyquist diagram Ny in a high frequency range is more likely to affect the battery capacity estimate value, the correction map 12 may be configured to correct the parameters that affect the shape of the Nyquist diagram Ny in a high frequency range. Thus, the correction map 12 may be configured to correct one(s) of the parameters of the equivalent circuit that is/are more likely to affect the battery capacity estimation. The pre-processing unit 16 may be configured to correct one(s) of the parameters of the equivalent circuit that is/are more likely to be affected by the ambient temperature of the measurement device 60, or one(s) that is/are more likely to affect the battery capacity estimation. The pre-processing unit 16 does not need to correct all the parameters of the equivalent circuit model 80. The pre-processing unit 16 may selectively correct one(s) of the parameters of the equivalent circuit that is/are more likely to be affected by the ambient temperature of the measurement device 60 or one(s) that is/are more likely to affect the battery capacity estimation.

Thus, the pre-processing unit 16 performs equivalent circuit analysis for the Nyquist plot Np that is obtained as a result of the AC-IR measurement performed at an arbitrary ambient temperature. Then, the pre-processing unit 16 obtains predetermined parameters of the equivalent circuit (the eight parameters in the case of the equivalent circuit model 80 shown in FIG. 3). Next, the pre-processing unit 16 corrects one(s) of the parameters of the equivalent circuit that is/are more likely to be affected by the ambient temperature Tk of the measurement device 60 or one(s) that is/are more likely to affect the battery capacity estimation, according to a correction formula and a correction map that are prepared in advance.

Thus, the pre-processing unit 16 may be configured to obtain image data of a Nyquist diagram Ny that is obtained when the AC-IR measurement is performed at a predetermined first temperature, based on the ambient temperature Tk and the information about the Nyquist plot Np, which are recorded in the first recording unit 11.

Figure 7:
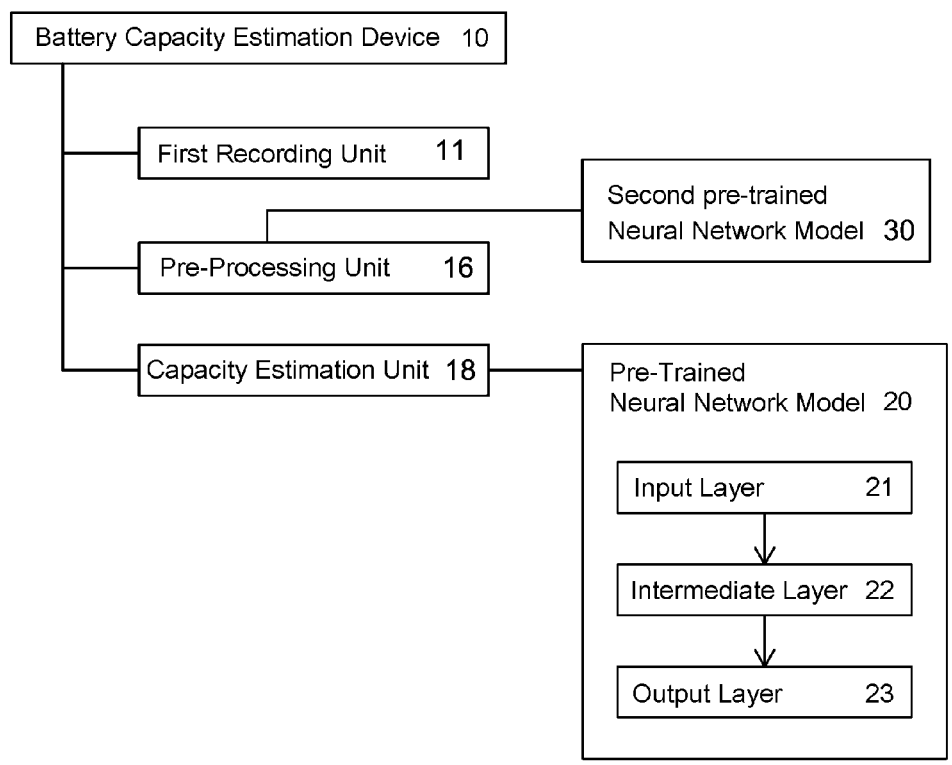
FIG. 7 is a configuration diagram illustrating another embodiment of the battery capacity estimation device 10.

The configuration of the pre-processing unit 16 is not limited to any of the embodiments described above. FIG. 7 is a configuration diagram illustrating another embodiment of the battery capacity estimation device 10. As illustrated in FIG. 7, the pre-processing unit 16 may include a second pre-trained neural network model 30. The second pre-trained neural network model 30 of the pre-processing unit 16 may be constructed, for example, so as to correct the required image data of the Nyquist diagram Ny, taking into consideration the influence that the ambient temperature of the measurement device 60 may have on the Nyquist diagram Ny. The second pre-trained neural network model 30 may be constructed so as to obtain the image data of the Nyquist diagram Ny that is obtained when the AC-IR measurement is performed at a predetermined first temperature, using the ambient temperature at which the AC-IR measurement is performed by the measurement device 60 and the image data of the Nyquist diagram Ny that is obtained at that ambient temperature, for example.

In this case, the second pre-trained neural network model 30 may learn second training data prepared for the battery to be measured. Here, the second training data contain an ambient temperature Tk at which the AC-IR measurement is performed, image data of a Nyquist diagram Ny1 that is obtained at that ambient temperature Tk, and image data of a Nyquist diagram Ny2 that is obtained by the AC-IR measurement performed at a predetermined first temperature T1, which are associated with each other. The pre-processing unit 16 may be constructed so as to obtain the image data of the Nyquist diagram Ny2 that is obtained when the AC-IR measurement is performed at a predetermined first temperature, based on the ambient temperature Tk and the image data of the Nyquist diagram Ny1, which have been input to the input layer of the second pre-trained neural network model 30.

Thus, the pre-processing unit 16 may be configured to obtain image data of the Nyquist diagram Ny that is obtained when the AC-IR measurement is performed at a predetermined first temperature, based on the ambient temperature of the measurement device 60 and image data of the Nyquist diagram Ny that is obtained at that ambient temperature, by utilizing the second pre-trained neural network model 30.

In the foregoing embodiment, the pre-processing unit 16 obtains the image data of the Nyquist diagram Ny2 that is obtained when the AC-IR measurement is performed at a predetermined first temperature, based on the ambient temperature Tk and the information about the Nyquist plot Np. However, the battery capacity estimation device 10 may not necessarily be provided with the pre-processing unit 16.

The battery capacity estimation method and the battery capacity estimation device 10 disclosed herein may be suitably applied to, for example, a method of and a device for estimating the battery capacity of a battery pack recovered from a vehicle.

A battery pack recovered from a vehicle is disassembled into modules, and thereafter, each of the modules is subjected to performance assessment. As a result of the performance assessment, the modules that are determined to be reusable are reused (rebuilt) as a part of a newly manufactured battery pack. However, depending on the structure of the battery pack, it is also possible to carry out the performance evaluation in the shape of battery pack without disassembling the battery pack. Furthermore, it is also possible to carry out the performance evaluation for each of the battery cells that make up the module.

In the present embodiment, the secondary battery cell (each of the battery cells that make up the module) is a nickel-metal hydride battery. Specifically, the positive electrode includes nickel hydroxide [$Ni(OH)_2$] containing a cobalt oxide additive. The negative electrode includes a hydrogen-absorbing alloy ($MnNi_5$-based alloy, which is a nickel-based alloy). The electrolyte solution includes potassium hydroxide (KOH). However, this is merely an illustrative example of specific cell structure, and it is possible to apply the technique illustrated in the present disclosure to various other types of secondary batteries.

Battery Logistics Model

Figure 8:
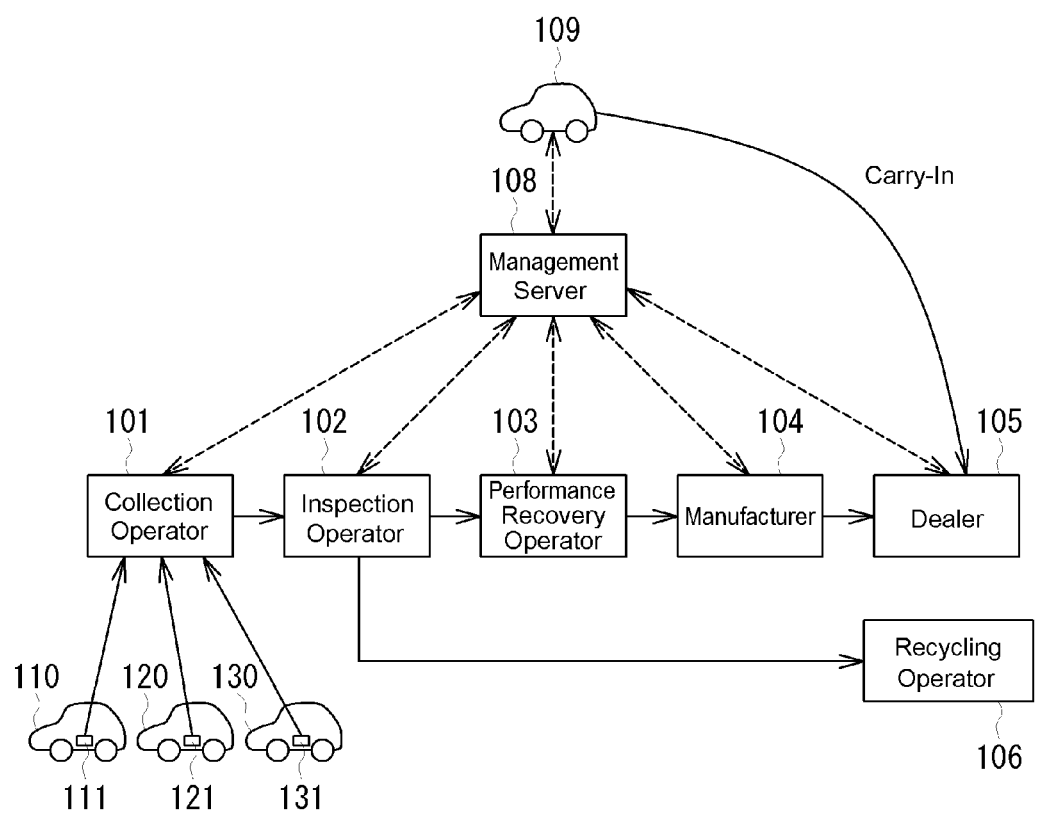
FIG. 8 is a schematic view illustrating a logistics model of secondary batteries, including collection, manufacturing (recycling), and sales of the batteries.

FIG. 8 is a schematic view illustrating a logistics model of secondary batteries, including collection, manufacturing (recycling), and sales of the batteries. In the example shown in FIG. 8, a collection operator 101 collects used secondary batteries (battery packs) 111, 121, and 131 from vehicles 110, 120, and 130. Although only three vehicles 110, 120, and 130 are illustrated in FIG. 8, secondary batteries are collected from a greater number of vehicles in a real situation. The collection operator 101 disassembles the collected battery packs to obtain a plurality of modules from each of the battery packs. In the example shown in FIG. 8, an identification number is assigned to each of the modules, and the information about each of the modules is managed by a management server 108. The collection operator 101 transmits the identification numbers of the modules obtained from the battery packs to the management server 108 using a terminal device (not shown).

An inspection operator 102 carries out performance assessment for each of the modules collected by the collection operator 101. For example, the inspection operator 102 assesses at least one electrical characteristic of each of the modules, including the battery capacity (for example, fully charged capacity), the resistance value, the open circuit voltage (OCV), and the state of charge (SOC) of each of the modules. The inspection operator 102 determines a plan for reusing the modules based on the results of the assessment. For example, the inspection operator 102 separates the modules into reusable modules and non-reusable modules based on the results of the assessment, and hands over the reusable modules to a performance recovery operator 103 and the non-reusable modules to a recycling operator 106. The results of the performance assessment for each of the modules is transmitted to a management server 108 by a terminal (not shown) of the inspection operator 102.

The performance recovery operator 103 carries out a process for recovering the performance of the modules that have been determined as reusable by the inspection operator 102. In an example, the performance recovery operator 103 charges the modules to an overcharged state so as to recover the fully charged capacity of the modules. However, it is possible that the performance recovery process by the performance recovery operator 103 may be eliminated for the modules that have been assessed to have low performance degradation in the performance assessment by the inspection operator 102. The results of the performance recovery for each of the modules is transmitted to the management server 108 by a terminal (not shown) of the performance recovery operator 103.

A manufacturer 104 manufactures battery packs using the modules of which the performance recovery operator 103 have recovered the performance. For example, the manufacturer 104 may replace a module showing degraded performance in a battery pack of a vehicle 109 with a module of which the performance recovery operator 103 have recovered the performance, to manufacture (rebuild) the battery pack of the vehicle 109.

A dealer 105 may sell the battery packs manufactured by the manufacturer 104 as battery packs for vehicle use or as battery packs for stationary use that may be usable in residential settings. A recycling operator 106 disassembles the modules that have been determined as non-reusable by the inspection operator 102, and recycles the modules for using them as a material for new battery cells or the like.

Note that FIG. 8 depicts the collection operator 101, the inspection operator 102, the performance collection operator 103, the manufacturer 104, the dealer 105, and the recycling operator 106 as different business entities. However, the types of business entities are not limited to the examples shown in FIG. 1. For example, the inspection operator 102 and the performance recovery operator 103 may be the same business entity. Also, the collection operator 101 may be fulfilled by two separate operators, one that collects battery packs and the other that disassembles the collected battery packs. The base locations of the operators and dealers are not limited to specific locations, and a plurality of operators are based at either the same location or different locations. It should be noted that FIG. 8 merely illustrates an embodiment to which the battery capacity estimation method and the battery capacity estimation device disclosed herein may be applied, and the battery capacity estimation method and the battery capacity estimation device may be applied to various other methods and devices in which a battery capacity is estimated in a variety of situations.

Various embodiments of the battery capacity estimation method and the battery capacity estimation device have been described hereinabove according to the present disclosure. Unless specifically stated otherwise, the embodiments of the battery capacity estimation method and the battery capacity estimation device described herein do not limit the scope of the present invention. It should be noted that various other modifications and alterations may be possible in the embodiments of the battery capacity estimation method and the battery capacity estimation device disclosed herein. In addition, the features, structures, or steps described herein may be omitted as appropriate, or may be combined in any suitable combinations, unless specifically stated otherwise.

What is claimed is:

1. A battery capacity estimation method comprising:
a first step of obtaining, by a predetermined AC-IR measurement, information about a Nyquist plot of a battery to be measured;
a second step of obtaining image data of a Nyquist diagram that is obtained when the AC-IR measurement is performed at a predetermined first temperature, based on the information about the Nyquist plot obtained in the first step and on an ambient temperature at which the AC-IR measurement is performed in the first step; and
a third step of inputting the image data of the Nyquist diagram obtained in the second step into a pre-trained neural network model, to obtain a battery capacity estimate value of the battery to be measured, wherein:
the neural network model comprises:
an input layer configured to receive the image data of the Nyquist diagram of the battery to be measured;
an intermediate layer configured to obtain the battery capacity estimate value based on the image data input to the input layer; and
an output layer configured to output the battery capacity estimate value obtained by the intermediate layer.

2. The method according to claim 1, wherein the pre-trained neural network model is configured to learn, for the battery to be measured, training data including the image data of the Nyquist diagram that is obtained by the AC-IR measurement performed at the predetermined first temperature and an assessment value of battery capacity, the image data and the assessment value being associated with each other, to thereby obtain the battery capacity estimate value based on the image data input to the input layer.

3. The method according to claim 1, wherein:
the intermediate layer includes a plurality of artificial neurons, each of the artificial neurons including at least one weighting factor indicating a strength of a connection between artificial neurons, and the intermediate layer is configured to perform a computation based on the weighting factor to obtain the battery capacity estimate value from the image data of the Nyquist diagram that are input to the input layer of the neural network model; and
the weighting factor is determined by learning, for the battery to be measured, training data including the image data of the Nyquist diagram that is obtained by a predetermined method based on the Nyquist plot obtained by the AC-IR measurement at the predetermined first temperature, and an assessment value of battery capacity, the image data and the assessment value being associated with each other.

4. The method according to claim 1, wherein:
the information about the Nyquist plot obtained in the first step includes parameters of an equivalent circuit for obtaining a Nyquist diagram from the Nyquist plot; and
the second step further comprises correcting at least one of the parameters of the equivalent circuit for obtaining the Nyquist diagram from the Nyquist plot obtained in the first step based on the ambient temperature at which the AC-IR measurement is performed in the first step, to obtain the image data of the Nyquist diagram that is obtained when the AC-IR measurement is performed at the predetermined first temperature.

5. The method according to claim 1, wherein the second step further comprises inputting an ambient temperature at which the AC-IR measurement is performed in the first step and image data of a Nyquist diagram obtained at the ambient temperature into a second pre-trained neural network model, to obtain the image data of the Nyquist diagram that is obtained when the AC-IR measurement is performed at the predetermined first temperature.

6. The method according to claim 5, wherein the second pre-trained neural network model is configured to learn, for the battery to be measured, second training data including an ambient temperature at which the AC-IR measurement is performed, image data of a Nyquist diagram that is obtained at the ambient temperature, and the image data of the Nyquist diagram that is obtained by the AC-IR measurement at the predetermined first temperature, which are associated with each other, to thereby obtain the image data of the Nyquist diagram that is obtained when the AC-IR measurement is performed at the predetermined first temperature, based on the ambient temperature and the image data of the Nyquist diagram that are input to the input layer of the second pre-trained neural network model.

7. A battery capacity estimation device comprising:
a first recording unit configured to record information about a Nyquist plot, and an ambient temperature when an AC-IR measurement is performed to obtain the Nyquist plot, in association with each other;
a pre-processing unit configured to obtain image data of a Nyquist diagram that is obtained when the AC-IR measurement is performed at a predetermined first temperature, based on the ambient temperature and the information about the Nyquist plot that are recorded in the first recording unit; and
a capacity estimation unit configured to obtain a battery capacity estimate value using a pre-trained neural network model,
the pre-trained neural network model including:
an input layer configured to receive the image data of the Nyquist diagram obtained by the pre-processing unit;
an intermediate layer configured to obtain the battery capacity estimate value based on the image data input to the input layer; and an output layer configured to output the battery capacity estimate value obtained by the intermediate layer.

8. The battery capacity estimation device according to claim 7, wherein the pre-trained neural network model is configured to learn training data in which, for the battery to be measured, the image data of the Nyquist diagram that is obtained by the AC-IR measurement performed at the predetermined first temperature are associated with an assessment value of battery capacity, to thereby obtain the battery capacity estimate value based on the image data input to the input layer.

9. The battery capacity estimation device according to claim 7, wherein:
the intermediate layer includes a plurality of artificial neurons, each of the artificial neurons including at least one weighting factor indicating a strength of a connection between artificial neurons, and the intermediate layer is configured to perform a computation based on the weighting factor to obtain the battery capacity estimate value from the image data of the Nyquist diagram that are input to the input layer of the neural network model; and
the weighting factor is determined by learning, for the battery to be measured, training data including the image data of the Nyquist diagram that is obtained by a predetermined method based on the Nyquist plot obtained by the AC-IR measurement at the predetermined first temperature, and an assessment value of battery capacity when the image data of the Nyquist diagram are obtained, the image data and the assessment value being associated with each other.

10. The battery capacity estimation device according to claim 7, further comprising:
a correction map recording an ambient temperature at which the AC-IR measurement is performed and a correction value for correcting one or more parameters of an equivalent circuit for obtaining a Nyquist diagram from a Nyquist plot, the ambient temperature and the correction value being associated with each other, and wherein:
the information about the Nyquist plot recorded in the first recording unit includes parameters of an equivalent circuit; and
the pre-processing unit is configured to correct at least one of the parameters of the equivalent circuit based on the parameters of the equivalent circuit that are obtained based on the information about the Nyquist plot recorded in the first recording unit, the ambient temperature recorded in the first recording unit, and the correction map, to obtain the image data of the Nyquist diagram that is obtained when the AC-IR measurement is performed at the predetermined first temperature.

11. The battery capacity estimation device according to claim 7, wherein:
the pre-processing unit includes a second pre-trained neural network model; and
the second pre-trained neural network model includes:
an input layer configured to receive an ambient temperature at which the AC-IR measurement is performed, and image data of the Nyquist diagram that is obtained at the ambient temperature; and
an intermediate layer configured to obtain the image data of the Nyquist diagram that is obtained when the AC-IR measurement is performed at the predetermined first temperature, based on the ambient temperature at which the AC-IR measurement is performed and the image data of the Nyquist diagram that is obtained at the ambient temperature.

12. The battery capacity estimation device according to claim 11, wherein the second pre-trained neural network model is configured to learn, for the battery to be measured, second training data including an ambient temperature at which the AC-IR measurement is performed, image data of a Nyquist diagram that is obtained at the ambient temperature, and the image data of the Nyquist diagram that is obtained by the AC-IR measurement at the predetermined first temperature, which are associated with each other, to thereby obtain the image data of the Nyquist diagram that is obtained when the AC-IR measurement is performed at the predetermined first temperature, based on the ambient temperature and the image data of the Nyquist diagram that are input to the input layer of the second pre-trained neural network model.

* * * * *